United States Patent [19]

Sandhu

[11] Patent Number: 5,102,830
[45] Date of Patent: Apr. 7, 1992

[54] INTEGRATED CIRCUIT FABRICATION PROCESS FOR PREVENTING OVERPROCESSING DURING A LASER SCAN

[75] Inventor: Gurtej S. Sandhu, Boise, Id.

[73] Assignee: Micron Technology, Inc., Boise, Id.

[21] Appl. No.: 556,970

[22] Filed: Jul. 24, 1990

[51] Int. Cl.⁵ ................ H01L 21/268; H01L 21/428
[52] U.S. Cl. ............................... 437/173; 437/225; 437/174; 148/DIG. 93
[58] Field of Search ........................ 437/173, 225

[56] References Cited

U.S. PATENT DOCUMENTS 4,476,375 10/1984 Ogawa .................... 219/121.72
4,509,161 4/1985 Van de Leest et al. .......... 369/275

FOREIGN PATENT DOCUMENTS 67042 4/1983 Japan.

OTHER PUBLICATIONS

S. P. Murarka, "Refractory Silicide for Integrated Circuits", J. Vac. Sci. Techol, 17(4), Jul./Aug. 1980, pp. 775-790.

Liu, Cheung, Lai, Heim, "A Study of Pulsed Laser Planarization of Aluminum for VLSI Metallization" Technical Article.

Shibata et al., "Metal Silicon Reactions Induced by CW Scanned Laser and Electron Beams", Tech. Art. Stanford Electronics Labs.

*Primary Examiner*—Brian E. Hearn
*Assistant Examiner*—Linda J. Fleck
*Attorney, Agent, or Firm*—Stephen A. Gratton; Robert A. de Groot

[57] ABSTRACT

A process for preventing overprocessing of an (IC) wafer or the like in an area of laser overlap. The invention in general comprises a process in which the surface of an (IC) wafer is coated with a composition which forms a light reflective surface upon the application of laser energy. Laser energy is thus reflected away from the wafer in areas of multiple laser exposure. In a preferred embodiment of the invention an (IC) wafer is coated with a nitrogen deficient titanium nitride film, which reacts with oxygen in the laser process chamber, to form a highly reflective titanium oxide film.

6 Claims, 3 Drawing Sheets

INTEGRATED CIRCUIT FABRICATION PROCESS FOR PREVENTING OVERPROCESSING DURING A LASER SCAN

FIELD OF THE INVENTION

This invention relates to the fabrication of integrated circuits (Ics) and more particularly to a novel process for preventing overprocessing of an (IC) part during a laser scan.

BACKGROUND OF THE INVENTION

In the fabrication of integrated circuits (ICs), pulsed lasers are often utilized for processing a metalized semiconductor wafer. Typically, a metal such as Aluminum (Al), is formed on a wafer substrate such as silicon (Si). During metallization, a thin film of the metal is deposited on the silicon substrate or on a silicide layer ($SiO_2$) formed on the substrate by a process such as sputtering, gas plating, or electroplating. A pulsed laser can then be utilized for further processing such as to melt and evenly distribute the metallic film on the substrate.

Laser processing may be used, for example, to solidly fill small contact vias on the substrate of an (IC) wafer and to induce the flow of molten metal into the contact vias. The laser melting of the metal film fills these micron sized windows while preserving various devices located on the (IC) wafer.

In use of laser processing, it often is desirable to apply enough laser energy to heat a metal film sufficiently to flow into the vias but not so much as to cause ablation or material loss of the metallic film. Optimal high and low laser energy limits, or a process window, is thus often present.

With laser processing, a laser light is typically pulsed over a square spot area which may be in the range of 1-5 mm on a side. In most instances, the laser light is scrambled and refocused through a homogenizer for uniformity. In practice, however, the intensity of the light beam is typically less along the outside edges and periphery of the laser spot and greater towards the center of the spot. This necessitates overlapping the laser spots to provide sufficient energy along the periphery of the square spot to melt and flow the metallic film. The metallic film, in this area of overlap, then receives two, or sometimes more, pulses of energy and may become overprocessed (i.e. ablated). A varying or spatially non-uniform pattern density can thus occur on a part such as an (IC) wafer.

In general, there is a need in the use of laser processes in the fabrication of integrated circuits, to compensate for the relatively large variations of laser energy which are experienced by different portions of the part being processed. The present invention is directed to a self-correcting process which allows laser energy in an area of laser overlap to be reflected away from the part to prevent overprocessing in this area.

SUMMARY OF THE INVENTION

In accordance with the present invention, a novel self-correcting process is described, for use in integrated circuit fabrication, for preventing laser overprocessing of an (IC) part, such as a metallic film formed on a semiconductor wafer. The invention, broadly stated, comprises a process in which a part to be laser treated is first coated with a chemical element or compound, such as a metallic film. This coating or metallic film is formulated to react in the presence of another element, such as a gas in the laser process chamber, during the laser process, to form a reflective coating on the wafer. The chemical formation of the reflective coating allows laser energy to be reflected away from an area of laser overlap to prevent overprocessing of the part.

In a preferred embodiment of the invention the process comprises the steps of:

- depositing a relatively thin (less than the penetration depth of the laser) film of nitrogen deficient titanium nitride (TiN) on a surface of a part to be laser processed;
- laser processing the part in an oxygen-rich environment and producing a light reflecting film of titanium dioxide ($TiO_2$), (hereinafter referred to as titanium oxide) as the result of a laser initiated reaction of titanium nitride (TiN) and oxygen ($O_2$);
- reflecting laser light from the titanium oxide ($TiO_2$) in areas of laser overlap, whereby laser processing is prevented; and
- removing the titanium oxide ($TiO_2$)/titanium nitride (TiN) films from the laser processed part.

In use of the process of the invention, a titanium oxide ($TiO_2$) film is formed in an area of each laser pulse by the laser induced chemical reaction of free oxygen ($O_2$) in the laser process chamber and free titanium (Ti) atoms on the nitrogen deficient titanium nitride (TiN) film previously deposited on the part. This titanium oxide ($TiO_2$) film is highly reflective and in an area of laser overlap reflects a relatively large portion of the laser energy away from the part. As is apparent, in an area of laser overlap, the reflective titanium oxide ($TiO_2$) has been produced by the previous laser pass. The excess energy impinging on the laser overlap area is thus automatically reflected away from the part by the additional highly reflective titanium oxide ($TiO_2$).

The formation of titanium oxide ($TiO_2$) may be enhanced further by the formation of an additional layer of titaniumm (Ti) which may be deposited o the nitrogen deficient titanium nitride (TiN) film. In this case, the combined depth of the titanium (Ti) and titanium nitride (TiN) films must be less than the penetration depth of the laser. This additional step is an option which is not critical to the process of the invention.

Other objects, advantages, and capabilities of the present invention will become more apparent as the description proceeds.

DETAILED DESCRIPTION OF THE PREFERRED EMBODIMENTS

Figure 3:
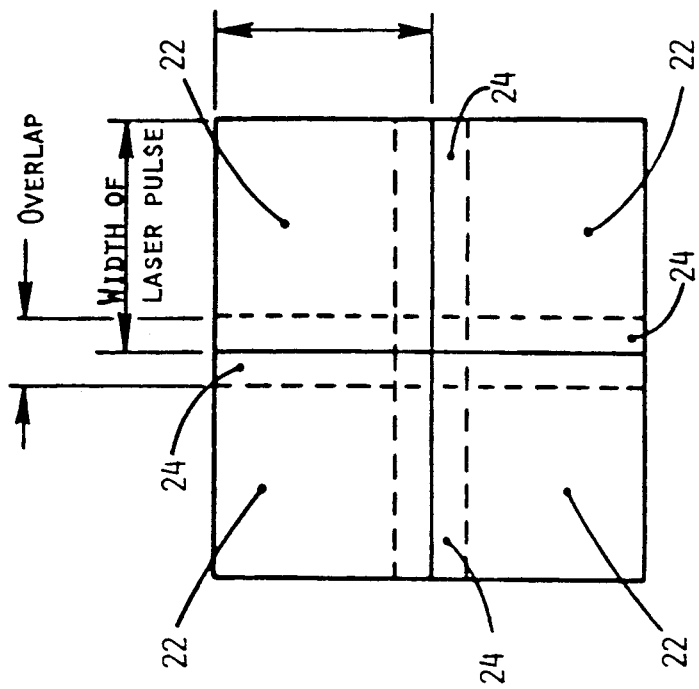
FIG. 3 is a prior art plan view of a square laser pattern for laser treating an (IC) wafer and showing the overlap of laser pulses.
Figure 1:
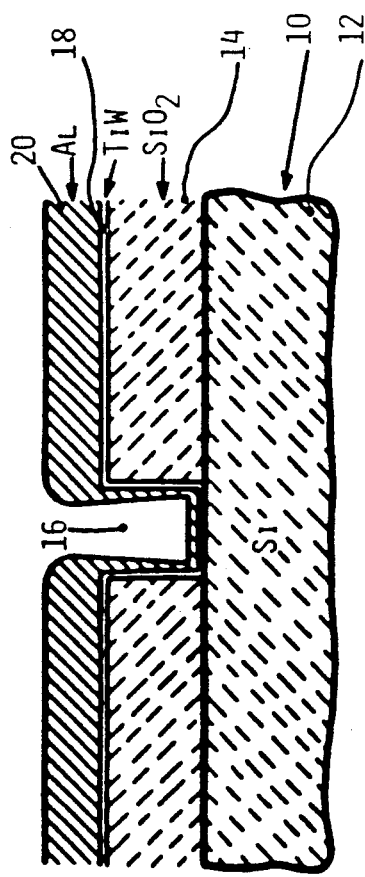
FIG. 1 is a prior art cross-section of a portion of an (IC) wafer showing a contact via formed on a silicon substrate and prior to laser treatment.
Figure 2:
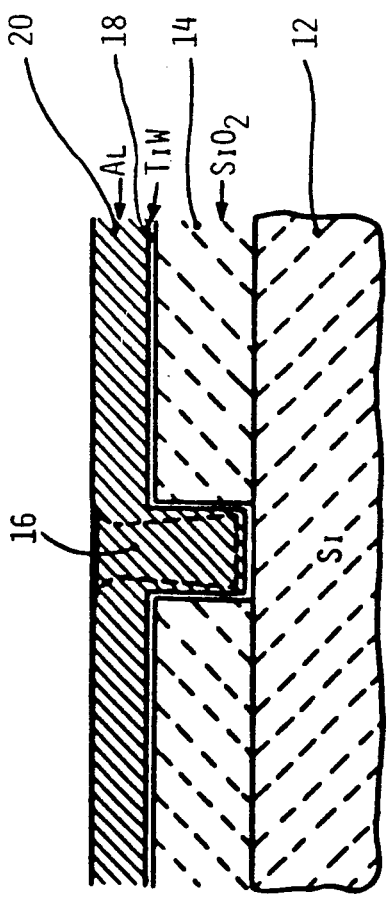
FIG. 2 is a prior art cross-section of a portion of an (IC) wafer shown after laser treatment wherein a metallic film has been laser heated to completely fill and plug a contact via.

Referring now to FIGS. 1-3, a typical prior art laser process used during the fabrication of (IC) wafers is illustrated. As shown in FIG. 1, an (IC) wafer 10 may include a silicon (Si) substrate 12 with a silicide ($SiO_2$) layer 14 formed thereon. A plurality of contact vias 16 may be formed on the silicide ($SiO_2$) layer 14. There may be on the order of $10^6$ of these contact vias 16 which may dominantly be on the order of about 1 $\mu$m in size. Typically, a diffusion barrier 18 having a thickness of about 1000 A, formed of a material such as (TiW), may also be sputter deposited or otherwise formed on the silicide layer 14. A conductor metallic film layer 20, such as aluminum, gold, nickel, lead, or silver, is sputtered, electro-deposited, or otherwise formed on top of this diffusion barrier 18. This conductor metallic film layer 20 is typically on the order of 0.5 $\mu$m thick.

As shown in FIG. 1, the typical conductor metallic film layer 20 coverage may be poor on the vertical side walls of the contact via 16. A laser pulse can thus be used to melt and flow the metallic film 20 into a contact via 16 to form a solidly plugged via 16 as shown in FIG. 2. As is known in the art, the laser may be a high-powered laser such as an XMR eximer laser which as an example, may produce a maximum energy output of about 350 mJ per pulse, with a pulse duration of 26 ns.

The laser light may be projected along a square spot size 22 (FIG. 3) which is typically on the order of 1-4.5 mm on one side. The laser is systematically moved vertically and horizontally across the wafer 10 so that the entire surface of the wafer 10 is treated. A representative laser pattern is shown schematically in FIG. 3.

The laser light is typically scrambled and refocused through a homogenizer for uniformity. In practice, however, the intensity of the laser pulse is usually less along the outer periphery of the square laser spot 22. This necessitates the use of an overlapping pattern of square spots 22 which is also shown in FIG. 3. As an example, the size of the laser overlap is typically on the order of about 10% of the total width of the square spot 22. In FIG. 3, the area of laser pattern overlap is shown in dotted lines and generally designated as 24.

As shown in FIG. 3, this overlapping laser pattern subjects some areas of the conductor film layer 20 to two, or more, separate laser pulses. This systematic non-uniform input of laser energy tends to create wafers 10 with non-uniform spatial characteristics. Additionally, areas subjected to multiple laser pulses may experience an ablated conductor film layer 18 having gaps or non-conducting openings.

The process of the present invention is directed towards the elimination of these prior art laser processing problems. The process of the invention broadly stated includes the steps of:
coating the surface of the part to be laser processed with a film which upon application of laser energy forms a light reflective surface;
reflecting the excess laser energy in an area of laser pulse overlap from the reflective surface; and
removing the film coating and reflective surface from the part.

Figure 4:
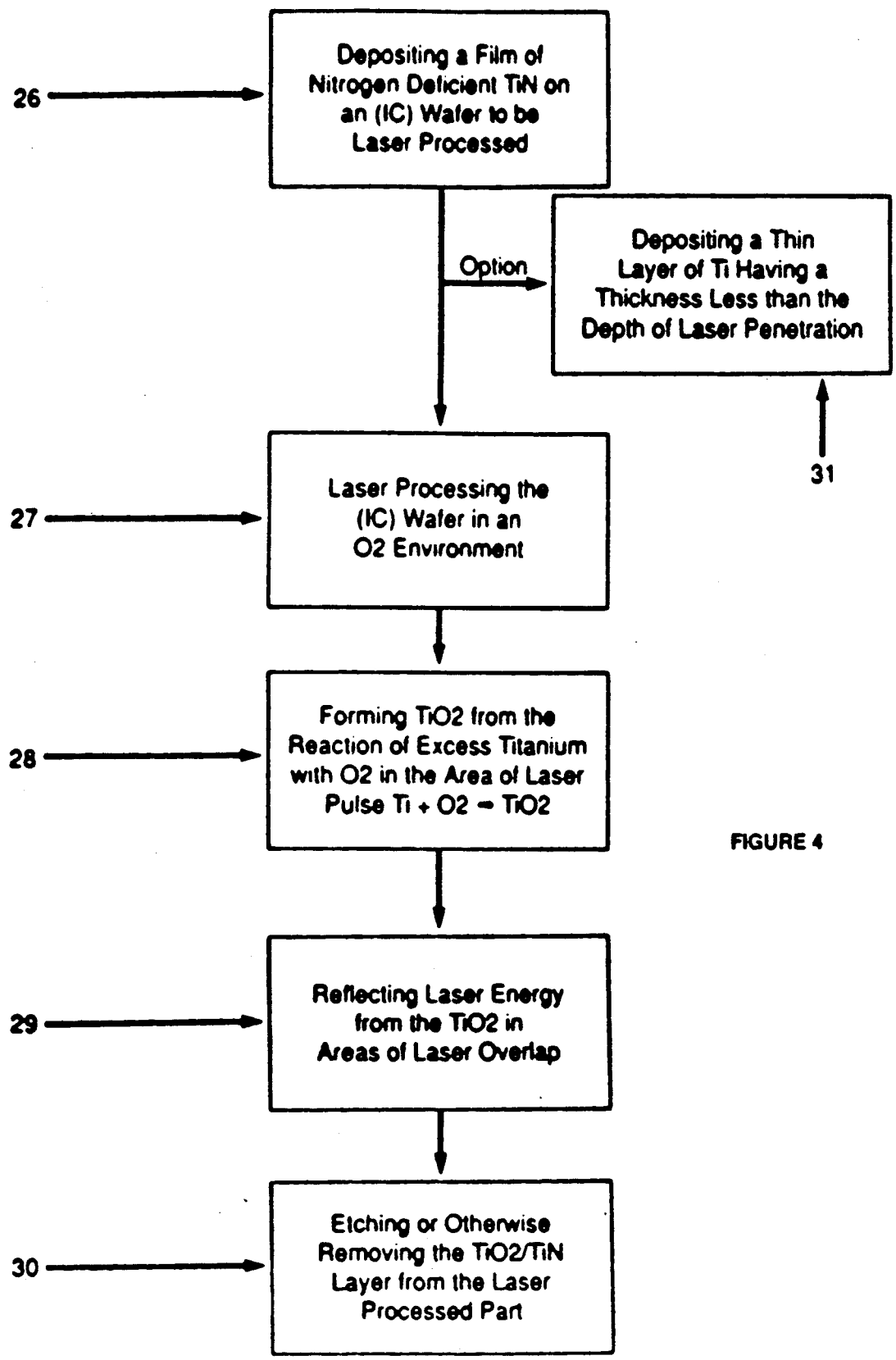
FIG. 4 is a schematic flow diagram of the process of the invention.

In a preferred embodiment of the invention and with reference to FIG. 4, the process of the invention includes the steps of:

depositing a film of nitrogen deficient titanium nitride (TiN) on an (IC) wafer 10 to be laser processed, step 26;
laser processing the (IC) wafer in an oxygen ($O_2$) rich environment, step 27;
forming titanium oxide ($TiO_2$) from the reaction of excess titanium (Ti) atoms on the wafer 10 and oxygen ($O_2$) in the laser process chamber 34 in the area of a laser pulse, step 28;
reflecting laser energy from the titanium oxide ($TiO_2$) formed in the area of laser overlap 24, step 29; and
etching or otherwise removing the titanium oxide ($TiO_2$)/titanium nitride (TiN) layer from the laser processed part, step 30. As an optional additional step, step 31, a thin layer of titanium nitride (TiN) may be deposited on the nitrogen deficient layer of titanium nitride (TiN) in order to enhance the formation of titanium oxide ($TiO_2$) in step 28.

Figure 5:
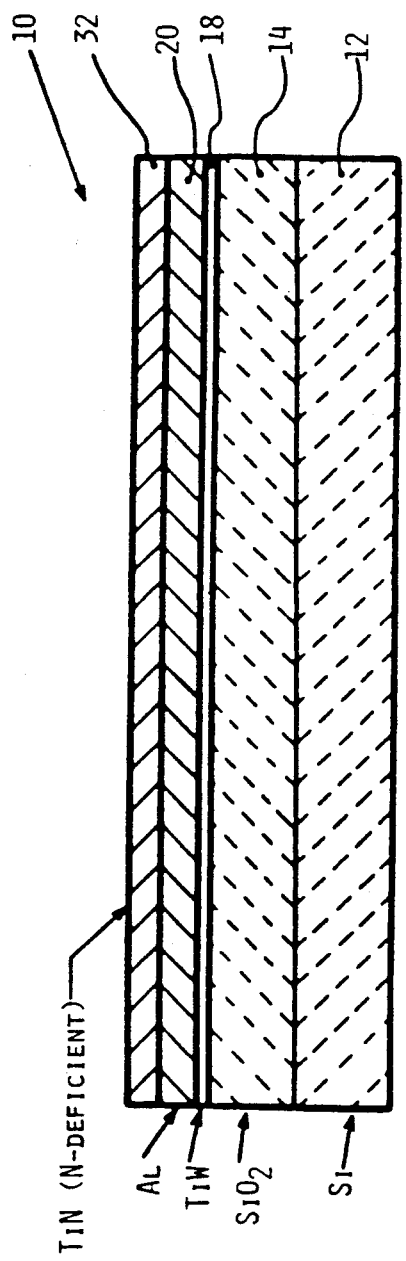
FIG. 5 is a schematic view of an initial step of the process of the invention.

With reference to FIG. 5, in accordance with the process of the invention, a nitrogen deficient layer of Titanium Nitride (TiN) 32, is first deposited on the surface of the conductor metallic film 20 which is to undergo laser processing. This titanium nitride (TiN) coating 32 is in the form of a thin metallic film which may completely cover the surface of the wafer 10.

The titanium nitride coating 32 may be sputtered, cosputtered, vapor deposited, or otherwise formed on the conductor film layer 20. The titanium nitride (TiN) coating 32 must be deposited to a thickness which is less than the depth of penetration of the laser in order to allow the laser to heat the conductor film layer 20 below.

During coating of the wafer with titanium nitride (TiN), step 26, (FIG. 4), the titanium nitride (TiN) film 32 is formed with a deficiency of nitrogen atoms such that there are extra titanium (Ti) atoms to react with oxygen ($O_2$) in the laser process chamber 34 to form titanium oxide ($TiO_2$) during step 28 (FIG. 4) of the process. This nitrogen deficiency is critical to the formation of titanium oxide ($TiO_2$) during step 28 (FIG. 4), of the process and may be accomplished by controlling the stoichiometry of the reactants during metal deposition of the titanium nitride (TiN) coating 32 on the wafer 10, step 26 (FIG. 4). This can be done by techniques such as cosputtering which are known in the art.

Figure 6:
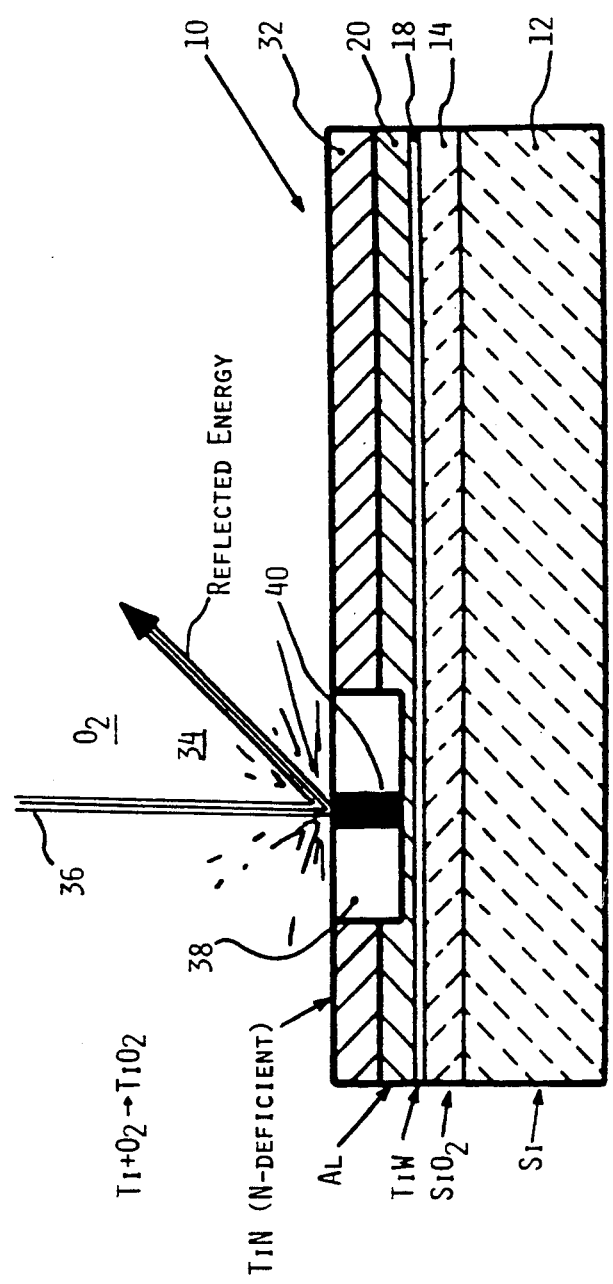
FIG. 6 is a schematic view of an (IC) wafer shown undergoing laser treatment conducted in accordance with the process of the invention to prevent overprocessing in an area of laser overlap.

With reference to FIG. 6, laser processing, step 27 (FIG. 4), of the process of the invention is carried out in an oxygen ($O_2$) environment. This may be accomplished by introducing pure oxygen ($O_2$) into the laser process chamber 34. As is known in the art during laser processing, step 27 (FIG. 4), the laser process chamber 34 is typically maintained at a very low pressure (i.e. $1 \times 10^{-6}$ Torr) by a turbo-molecular pump or the like.

As shown schematically in FIG. 6, a laser beam 36 is directed at the surface of the wafer 10 and penetrates through the nitrogen deficient titanium nitride (TiN) film 32 and into the conductor film layer 20 of the wafer 10 to process the conductor film layer 20 as previously described. The laser energy impinging upon the titanium nitride (TiN) coating 32 initiates a chemical reaction in which free titanium atoms on the titanium nitride (TiN) coating 32 combine with oxygen ($O_2$) in the laser process chamber 34 to form a titanium oxide ($TiO_2$) film 38 on the surface of the wafer 10. This is step 28 (FIG. 4) and can be characterized by the chemical reaction: $Ti + O_2 = TiO_2$. This reaction occurs spontaneously as a result of the proximity of the reactants and with the input of laser energy.

As illustrated in the following table, the titanium oxide (TiO$_2$) film 38 which is formed by the reaction Ti+O$_2$=TiO$_2$, of step 38 (FIG. 4), has a reflectivity which is approximately three times greater than that of the originally deposited titanium nitride (TiN) film 32, step 26 (FIG. 4).

TABLE I

Relative optical reflectivity data for thin films

| Material | % Reflectivity |
|---|---|
| Silicon (Si) | 100 |
| Titanium (Ti) | 110 |
| Titanium Nitride (TiN) | 14 |
| Titanium Oxide (TiO$_2$) | 39 |

The high reflectivity of the titanium oxide (TiO$_2$) film 38 causes laser energy to be reflected away from an area of laser overlap 40. This is step 29 (FIG. 4) of the process of the invention and is shown schematically in FIG. 6.

The reflection of laser energy by the titanium oxide (TiO$_2$) film 38 in an area of laser overlap 40 prevents overprocessing in the area of laser overlaps 40, (i.e. the thermal budget is maintained). This is accomplished automatically with the formation of the titanium oxide (TiO$_2$) film 38. As is apparent, in areas of laser overlap 40, a titanium oxide film 38 is present from the previous laser pass and thus reflects the excess energy caused by the subsequent laser pass.

After the laser processing is completed, step 29 (FIG. 4), the titanium nitride (TiN) film 32 and titanium oxide (TiO$_2$) film 38 can be removed from the wafer 10 surface by suitable processes such as etching.

As is apparent from description, with the process of the invention, laser processing of (IC) parts can be closely controlled. In particular, part errors introduced by variations in the degree of overlap between successive laser overlaps is automatically corrected. Additionally, the stoichiometry of the titanium nitride (TiN) film 32 and titanium oxide (TiO$_2$) film 38 can be manipulated by techniques known by those skilled in the art, to accurately control the laser power absorbed during the process. Moveover, successful use of the process of the invention can lead to more accurate control of the thickness and stoichiometry of the conducting metallic film 20. The process of the invention can be easily performed with the addition of simple steps to conventional technology.

As an optional additional step and as shown in FIG. 4, step 31, a thin layer of titanium (Ti) may be formed on the titanium nitride (TiN) 32 film in order to provide more free titanium (Ti) atoms to enhance the formation of titanium oxide (TiO$_2$) in step 28 (FIG. 4). As before, the combined depth or thickness of the titanium nitride (TiN) film 32 and the optional titanium (Ti) film must be less than the depth of penetration of the laser, in order to allow the laser to penetrate into the conductor film layer 20.

While the process of the invention has been described with reference to a preferred embodiment, in which titanium nitride (TiN), is combined with oxygen (O$_2$) to form a highly reflective titanium oxide (TiO$_2$) film, it should be understood that other chemical combinations may also be utilized in this application to produce a reflective film upon exposure to laser energy. As will be apparent to those skilled in the art these certain changes and modifications can be made without departing from the scope of the invention as defined by the following claims.

What is claimed is:

1. A process for use in the laser treatment of an integrated circuit (IC) product comprising:
   a. depositing a surface to be laser treated with a film formed of nitrogen deficient titanium nitride (TiN) which upon application of laser energy forms a light reflective surface;
   b. providing oxygen gas for reaction with titanium atoms to form a titanium oxide (TiO$_2$) reflecting film;
   c. reflecting laser light from the light reflective surface in areas of overlapping laser exposure to prevent overprocessing in the areas of overlapping laser exposure; and
   d. removing the TiN and TiO$_2$ films from the laser treated product.

2. A process for use in the laser treatment of an integrated circuit (IC) product comprising:
   a. depositing a surface to be laser treated with a film formed of nitrogen deficit titanium nitride (TiN) which upon application of laser energy forms a light reflective surface;
   b. depositing a thin layer of titanium (Ti) on the TiN film;
   c. providing oxygen gas for reaction with titanium atoms to form a titanium oxide (TiO$_2$) reflecting film;
   d. reflecting laser light from the light reflective surface in areas of overlapping laser exposure to prevent overprocessing in the areas of overlapping laser exposure; and
   e. removing the films from the laser treated product.

3. A process for use with laser treatment of an (IC) wafer comprising:
   a. depositing a film of nitrogen deficient titanium nitride (TiN) on an (IC) wafer to be laser processed;
   b. depositing a thin layer of titanium (Ti) on the (IC) wafer;
   c. laser processing the (IC) wafer in a process chamber having oxygen (O$_2$) gas;
   d. forming a titanium oxide (TiO$_2$) film from the reaction of free titanium (Ti) atoms on said titanium nitride (TiN) film with (O$_2$) in the process chamber by the chemical reaction Ti+O$_2$=TiO$_2$ upon application of laser energy;
   e. reflecting laser energy from the titanium oxide (TiO$_2$) film in areas of laser overlap; and
   f. etching the titanium oxide (TiO$_2$), titanium, and titanium nitride (TiN) films from the laser processed wafer.

4. In a laser process wherein laser energy is applied in a reaction chamber to an (IC) wafer, a process comprising:
   a. forming a light reflecting titanium oxide film from a combination of a nitrogen deficient titanium nitride (TiN) film deposited on the wafer and oxygen gas introduced into the reaction chamber;
   b. reflecting laser light from the light reflecting TiO$_2$ film in areas of overlapping laser exposure;
   c. whereby overprocessing by multiple laser exposure may be prevented; and
   d. removing the titanium nitride (TiN) and titanium oxide (TiO$_2$) from the laser processed part.

5. A process for preventing overprocessing of a laser treated part in an integrated circuit (IC) wafer comprising:
   a. depositing a film of nitrogen deficient titanium nitride (TiN) on a conductive metallic surface of the (IC) wafer;
   b. depositing a layer of titanium (Ti) having a thickness which in combination with the titanium nitride (TiN) film is less than a laser penetration depth;
   c. admitting oxygen ($O_2$) into a laser process chamber;
   d. laser processing the (IC) wafer to apply laser energy to the conducting metallic surface;
   e. forming titanium oxide ($TiO_2$) from the reaction of titanium (Ti) atoms with oxygen ($O_2$) by the reaction of $Ti + O_2 = TiO_2$ in the area of a laser pulse;
   f. reflecting laser energy from the titanium oxide ($TiO_2$) in areas of laser overlap; and
   g. removing the titanium oxide ($TiO_2$) and titanium nitride (TiN) from the laser processed wafer.

6. In a laser process wherein laser energy is applied in a reaction chamber to an (IC) wafer, a process comprising:
   a. depositing a nitrogen-deficient titanium nitride (TiN) film on the wafer;
   b. depositing a thin layer of titanium (Ti) on the titanium nitride (TiN) film with a combined thickness being less than a laser penetration depth;
   c. forming a light reflecting titanium oxide ($TiO_2$) film from a combination of the TiN film deposited on the wafer and oxygen gas introduced into the reaction chamber;
   d. appyling laser energy to the wafer;
   e. reflecting laser light from the light reflecting material in areas of overlapping laser exposure; and
   whereby overprocessing by multiple laser exposure may be prevented.

* * * * *